United States Patent
Liang et al.

(10) Patent No.: US 7,094,675 B2
(45) Date of Patent: Aug. 22, 2006

(54) STRUCTURE HAVING SPATIALLY SEPARATED PHOTO-EXCITABLE ELECTRON-HOLE PAIRS AND METHOD OF MANUFACTURING SAME

(75) Inventors: Yong Liang, Richland, WA (US); John L. Daschbach, Richland, WA (US); Yali Su, Richland, WA (US); Scott A. Chambers, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 567 days.

(21) Appl. No.: 10/340,502

(22) Filed: Jan. 10, 2003

(65) Prior Publication Data

US 2003/0146431 A1 Aug. 7, 2003

Related U.S. Application Data

(62) Division of application No. 09/722,127, filed on Nov. 22, 2000, now Pat. No. 6,534,782.

(51) Int. Cl.
*H01L 21/44* (2006.01)

(52) U.S. Cl. .................. 438/608; 438/678; 438/679; 438/687

(58) Field of Classification Search .......... 438/597, 438/607, 608, 610, 678, 679, 687
See application file for complete search history.

(56) References Cited

U.S. PATENT DOCUMENTS

| | | | |
|---|---|---|---|
| 5,482,890 A | 1/1996 | Liu et al. | |
| 5,906,670 A | 5/1999 | Dobson et al. | |
| 5,958,573 A | * 9/1999 | Spitler et al. | ............... 428/323 |
| 5,997,958 A | 12/1999 | Sato et al. | |

FOREIGN PATENT DOCUMENTS

EP  0 926 260  6/1990

OTHER PUBLICATIONS

Brazdeikis et al. "An Atomic Force Microscopy Study of thin copper oxide films grown by molecular beam epitaxy on MgO(100)," pp. 57–59, 1996.*

Gao et al. "Heteroepitaxial growth of $\alpha$–Fe2O3, K–Fe2O3 and Fe3O4 thin films by oxygen–plasma–assisted molecular beam epitaxy", pp. 446–454, 1997.*

Vossen et al. "Thin Film Processes", copyright Academic Press, Inc. 1978, pp. 41–43.*

Kawaguchi K et al., "Molecular Beam Epitaxy Growth of CuO and Cu2O Films with Controlling the Oxygen Content by the Flux Ratio of Cu/O•. " pp. 221–226. 1994.

Saponjic Z et al., "Tailor Made Synthesis of Q–TiO2 Powder by Using Quantum Dots as Building Blocks." pp. 333–339. 1998.

* cited by examiner

*Primary Examiner*—Tom Thomas
*Assistant Examiner*—N. Drew Richards
(74) *Attorney, Agent, or Firm*—James D. Matheson

(57) ABSTRACT

A method for producing quantum dots. The method includes cleaning an oxide substrate and separately cleaning a metal source. The substrate is then heated and exposed to the source in an oxygen environment. This causes metal oxide quantum dots to form on the surface of the substrate.

4 Claims, 3 Drawing Sheets

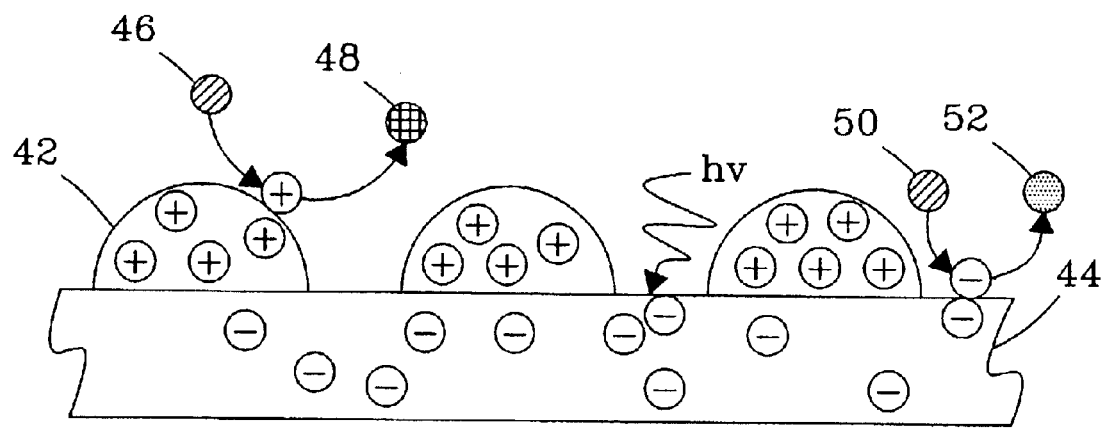
*Fig. 5*
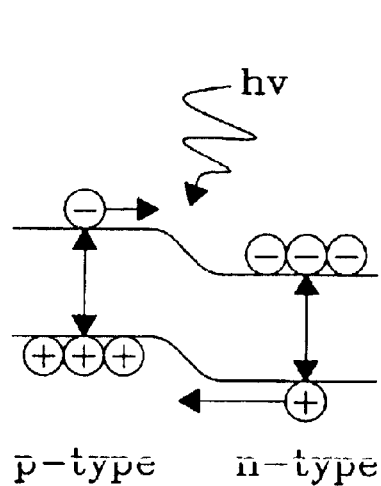 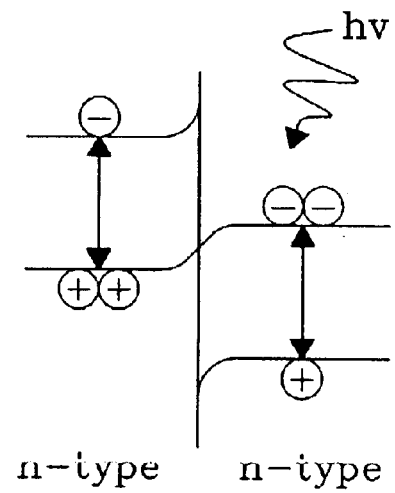
*Fig. 6a*  *Fig. 6b*

STRUCTURE HAVING SPATIALLY SEPARATED PHOTO-EXCITABLE ELECTRON-HOLE PAIRS AND METHOD OF MANUFACTURING SAME

CROSS REFERENCE TO RELATED APPLICATION

This patent application is a divisional application of Ser. No. 09/722,127 filed Nov. 22, 2000, now U.S. Pat. No. 6,534,782.

STATEMENT REGARDING FEDERALLY SPONSORED RESEARCH OR DEVELOPMENT

This invention was made with Government support under Contract DE-AC0676RLO1830 awarded by the U.S. Department of Energy. The Government has certain rights in the invention.

FIELD

This disclosure relates to a structure having quantum dots, more particularly to a structure having metal oxide quantum dots formed on an oxide substrate.

BACKGROUND

Quantum devices, such as dots, wires and wells, rely upon the quantization of energy into discrete energy levels. If electrons become trapped into a structure with at least one reduced dimension, the density of electron states, and the energy levels that electrons can occupy, become quantized. Quantum dots may be formed by thin-film deposition techniques including molecular beam epitaxy (MBE) and chemical vapor deposition (CVD). In order to lengthen the electron-hole pair lifetime in the system consisting of the quantum dot and its substrate, relative to the bulk material, a material system may separate photo-excited electrons and holes by virtue of it's electronic structure. The essential property is that the energies of the valence and conduction band edges in one material must be concomitantly lower or higher than the other material, which is the definition of a type II heterostructure.

The separation of electrons and holes provides relatively long-lived electrons and holes useful in a number of applications including photocatalysis. These electrons and holes can be transferred to molecules or ions at the surface, causing an oxidation-reduction (redox) reaction. Typical photocatalytic applications include energy production and removal of organic pollutants.

In photocatalytic applications, the use of oxides is relatively common. Oxide materials are stable and promote the redox reactions desired. However, no known photocatalytic applications use the unique characteristics of oxide quantum dots grown on crystalline oxide substrates. These include the separation of charge carriers brought about by the presence of a type II heterojunction and the presence of these carriers on the same side of the material.

One common problem with the current state of the art is the relatively short lifetime of photoexcited electron-hole pairs. The speed at which the electrons and holes recombine limits the availability of the separate electrons and holes. In order to be useful for many applications, such as photocatalysis as well as photodetection and other applications, the recombination time must be longer than the heterogeneous electron transfer reaction rate. Spatial separation can increase this time, but current embodiments of quantum dot formation do not provide sufficient spatial separation.

Therefore, while the use of oxides in thin films may be known, as is the growth of quantum dots, no current material system exists that use oxide quantum dots.

SUMMARY

One aspect of the disclosure is a method for producing quantum dots. The method includes cleaning an oxide substrate and separately cleaning a metal source. The substrate is then heated and exposed to the source, causing the quantum dots to form on the surface of the substrate. The quantum dots will be substantially made up of metal oxide. The substrate may be $SrTiO_3$, $TiO_2$, or $\alpha\text{-}Cr_2O_3$, among others. The dots may be $Cu_2O$, $\alpha\text{-}Fe_2O_3$, among others.

Another aspect of the disclosure is a structure having metal oxide quantum dots on an oxide substrate. The substrate may be $SrTiO_3$, $TiO_2$, or $\alpha\text{-}Cr_2O_3$, among others. The dots may be $Cu_2O$, $\alpha\text{-}Fe_2O_3$, among others. When the quantum dots are exposed to light, the holes are substantially confined to the quantum dots and the electrons to the substrate.

BRIEF DESCRIPTION OF THE DRAWINGS

The invention may be best understood by reading the disclosure with reference to the drawings, wherein:

FIG. 5 shows a schematic of spatial separation and charge transfers of photo-excited electrons and holes upon photo-excitation, in accordance with the invention.

FIG. 6a shows a schematic of a lack of an induced interfacial electrostatic barrier at p-type/n-type interface in accordance with the invention.

FIG. 6b shows a schematic of an induced barrier at an n-type/n-type interface in accordance with the invention.

DETAILED DESCRIPTION OF THE EMBODIMENTS

Figure 1:
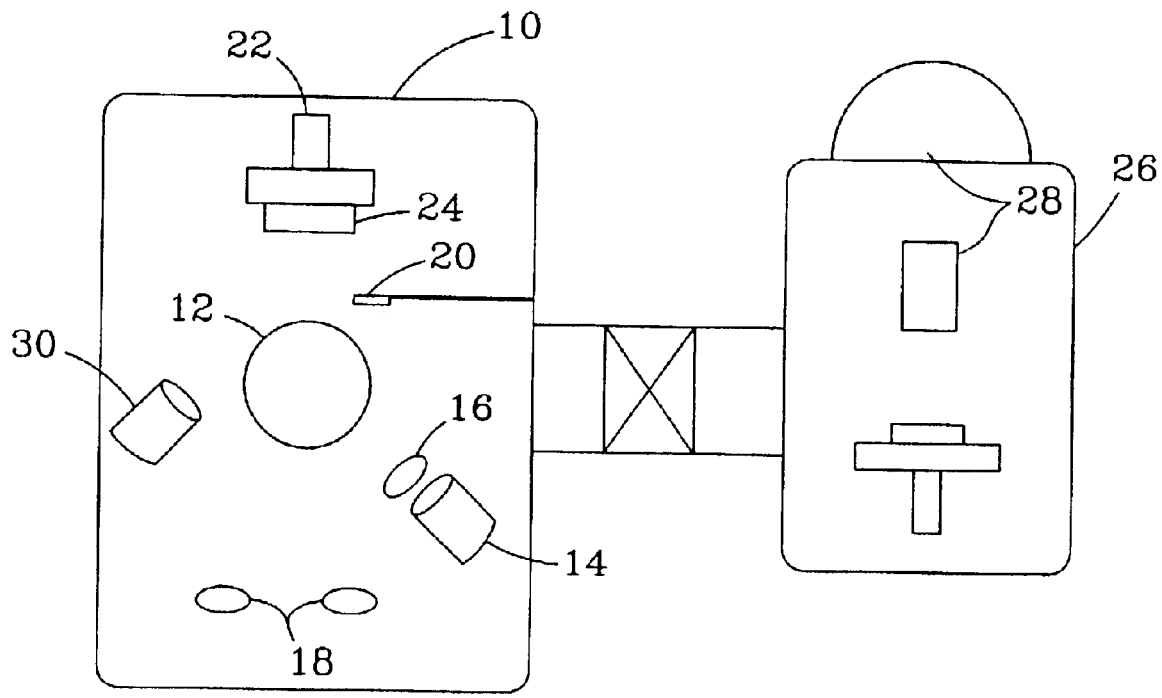
FIG. 1 shows one embodiment of an apparatus used to produce quantum dots on a substrate.

One embodiment of an apparatus for forming quantum dots on a substrate is shown in FIG. 1. The apparatus includes a molecular beam epitaxy (MBE) growth chamber 10. The growth chamber 10 is equipped with high-energy electron diffraction (RHEED) 12, an effusion cell 14 having a shutter 16 and two electron beam (e-beam) cells 18.

In addition, the chamber includes a quartz crystal thickness monitor 20. A manipulator 22 allows for mounting of the substrate 24 and subsequent heating of the substrate 24. The substrate 24 is mounted with the (001) surface exposed. The apparatus also has an appended characterization chamber 26 equipped with x-ray photoelectron spectroscopy (XPS) 28 for surface composition and chemical state characterizations.

Figure 2:
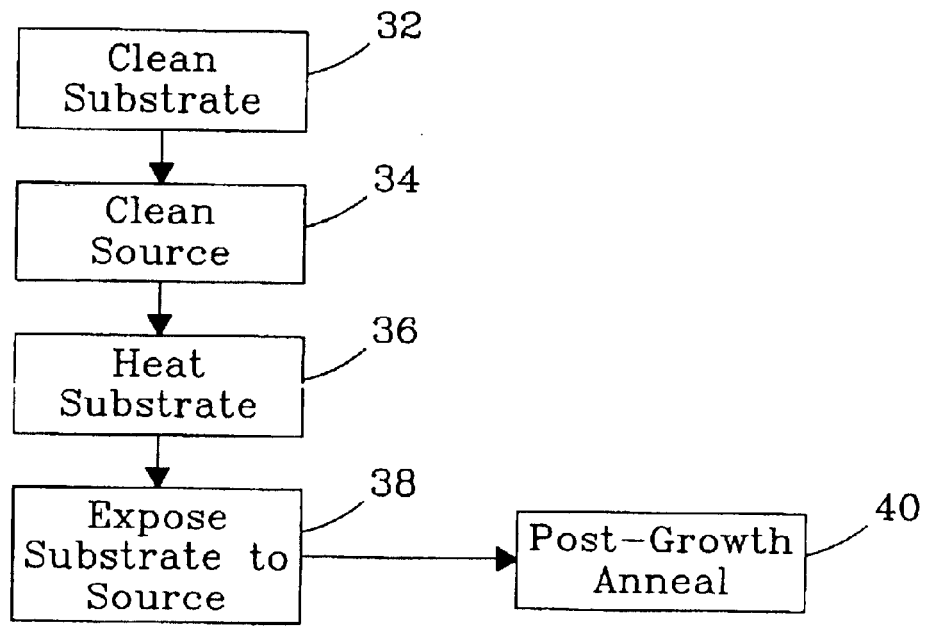
FIG. 2 shows a flowchart of one embodiment of a method to produce quantum dots on a substrate.

Referring to FIG. 1 in conjunction with FIG. 2, it is possible to set out a method for producing quantum dots on a substrate in accordance with the invention. The method discussed is one example of a MBE method to produce these dots and is not intended to limit the scope of the invention, but is for discussion purposes only.

At 32 in FIG. 2, the substrate to be exposed to a source is cleaned. In this particular embodiment, the surface of the substrate is cleaned and outgassed in the growth chamber 10 of FIG. 1. In this example, the substrate is comprised of strontium, titanium and oxygen, specifically $SrTiO_3$. Other options for the substrate include $TiO_2$ (anatase), which will just be referred to as $TiO_2$ in this discussion. Both of these would be used with a copper source in $Cu_2O/SrTiO_3$ and $Cu_2O/TiO_2$ material systems. Another option would be to use an iron source with $\alpha$-$Cr_2O_3$ substrate, in a $\alpha$-$Fe_2O_3$/$\alpha$-$Cr_2O_3$ system. The specific temperature and pressure ranges below are for a $Cu_2O/SrTiO_3$ material system. However, those skilled in the art can adjust the parameters for the other material systems.

The cleaning of the substrate surface can be done by exposing the substrate surface to an oxygen plasma source 30 at an oxygen partial pressure approximately equal to $2\times10^{-5}$ Torr at a substrate temperature of 550° to 600° Celsius (C.). The resulting surface will have an ordered (1×1) structure, which can be verified by the in situ RHEED 12. The XPS 28 can be used to verify that the surface is free of contamination, such as carbon.

Referring to FIG. 2, the source is then cleaned. This can be accomplished by heating the source, in this example solid copper (Cu), in the effusion cell 14. The source should be heated to a sufficiently high temperature, typically in the range of 980° C. to 1040° C., such that the solid Cu source evaporates atomic Cu at a constant rate. Using the quartz crystal thickness monitor 20 placed at the sample growth location, the flux of the Cu should be in the range of 0.02 angstroms/second to 0.1 angstroms/second.

At 36 in FIG. 2, the substrate is heated after the cleaning of the substrate and the source. The substrate temperature should reach and maintain a point generally between 530° C. and 600° C. This is done in an oxygen plasma environment with an oxygen partial pressure between $7\times10^{-7}$ Torr to $1.5\times10^{-6}$ Torr.

When the source and substrate reach the necessary conditions, such as those discussed above, the substrate surface is exposed to the source at 38 in FIG. 2. This is accomplished in the example by opening the shutter 16 in front of the effusion cell 14. This initiates the growth of copper oxide ($Cu_2O$) on the substrate in the example chamber of FIG. 1.

The thickness of the copper oxide is monitored by the quartz crystal thickness monitor 20, which will be located in the same plane as the substrate surface 24, but displaced some distance away in the lateral direction. In the example of FIG. 1, for example, the monitor 20 is placed 2.5 centimeters away from the $SrTiO_3$ substrate.

Figure 3:
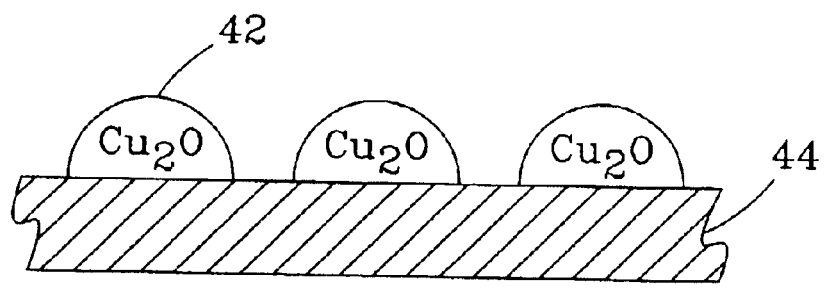
FIG. 3 shows one embodiment of a substrate upon which are formed quantum dots.

Upon completion of this process, nanoscale dots will have formed on the surface of the substrate. In this particular example, there is significant compressive stress on the interface between the dots and the substrate and the dots form as a means to relax this stress. Referring to FIG. 3, examples of these copper oxide dots 42 on the $SrTiO_3$ substrate 44 can be seen. The compressive stress serves as the driving force in the formation of the dots 42. The compressive stress results from the properties of these two particular materials. Both of these materials have four-fold symmetry and a square unit cell. However, they have different lattice constants. The substrate 44 has a lattice constant of 3.92 angstroms and the dots have a lattice constant of 4.27 angstroms. This results in an 8.9% ((4.27−3.92)/3.92) lattice mismatch between the materials.

The dots of FIG. 3 have a lateral dimension of approximately 40 nanometers with a height of approximately 20 nanometers. This can be determined by atomic force microscopy (AFM). In addition, high resolution scanning Auger microscopy (SAM) can be used to identify the elemental distribution on $Cu_2O/SrTiO_3$ surfaces. Such an analysis performed on a structure formed in the specific example discussed above showed that the dot areas are rich in copper but oxygen deficient. In addition, a SAM map of titanium shows that the Ti content is much higher in the flat areas not covered by the dots. The amount of copper in these areas was found to be less than 2 atomic percent. This is far lower than is necessary to form a monolayer of $Cu_2O$.

The conclusion is therefore that the substrate is mostly exposed in these areas. The combination of these analyses for the example discussed above leads to the conclusion that the dots are grown on the substrate with exposed substrate in between. During photoexcitation, this spatial separation has the advantage of confining the electrons and holes a relatively great distance from each other, slowing the recombination rate. This is one of the unique characteristics mentioned previously.

Controlling the amount of time of exposure between the substrate and the source controls the size of the dots. The dots may have a lateral dimension ranging from less than 20 nanometers to over 100 nanometers. An optional step of post-growth annealing can result in a reduction in dot size to less than 10 nanometers in diameter. An example of such a process would be to expose the $Cu_2O$ dots to oxygen plasma with higher oxygen partial pressure approximately equal to $1\times10^{-5}$ Torr, at a temperature in the range of 620–650° C. Under these conditions, the dots began to sublimate, resulting in reduction of the dot size.

Figure 4:
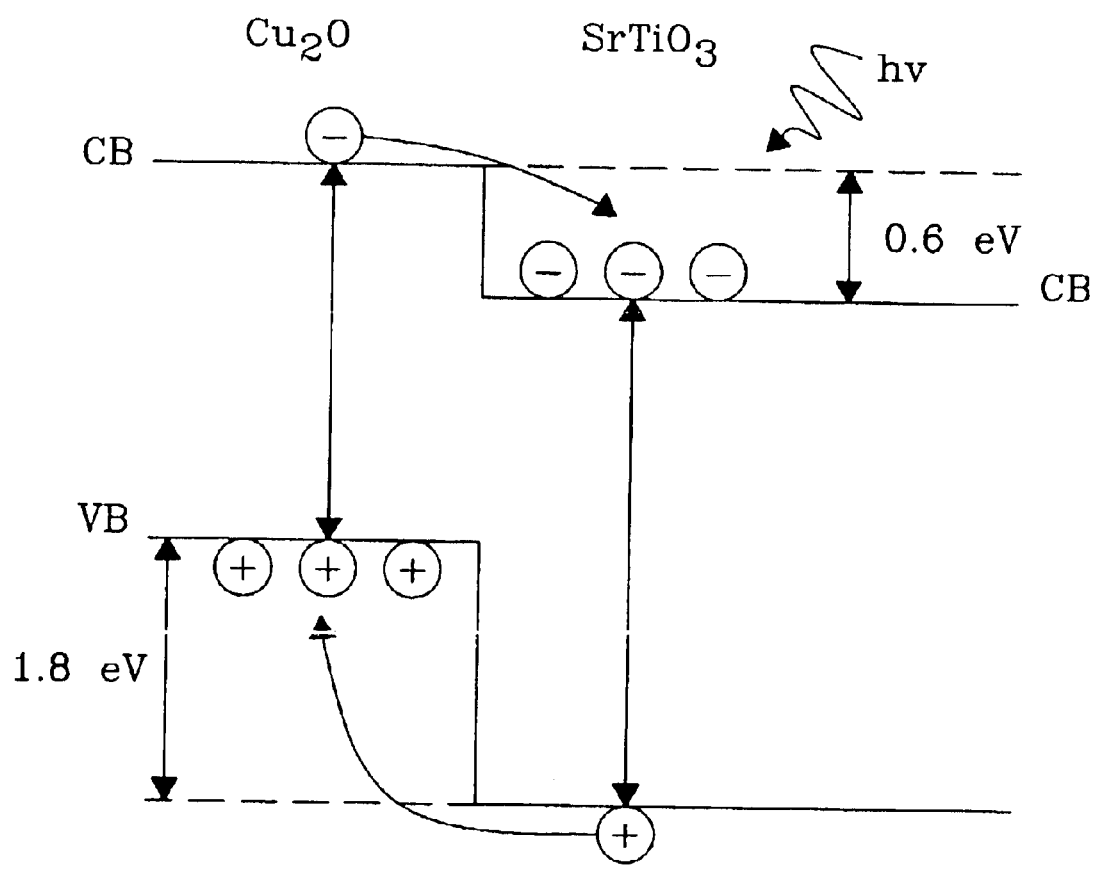
FIG. 4 shows a schematic of the relative conduction and valence positions at a substrate/dot interface, in accordance with the invention.

The properties of these dots, whether annealed or not, indicates favorable conditions for slower recombination. As can be seen by the diagram of FIG. 4, the band offsets are in the range of approximately 0.5 to 0.6 electron volts (eV) for the conduction band and in the range of approximately 1.6 to 1.8 eV for the valence bands. Upon photo-excitation, shown by the arrow "hv" in FIG. 4, the holes (+) energetically prefer to be in the valance band (VB) of $Cu_2O$. Electrons (−) will migrate to the conduction band (CB) of $SrTiO_3$.

FIG. 5 shows that upon above-gap-irradiation (hv) photo-excited holes are mostly confined to the dots, while the electrons are located in the substrate, sequestering the holes and electrons on the same side of the substrate. An advantage of this result for photocatalysis is that photo-oxidation and photo-reduction reactions can occur simultaneously on the same side of the substrate 44. These reactions are shown by the molecules 46 oxidizing into 48, and molecule 50 reducing to 52, respectively.

An additional advantage of this structure is that $Cu_2O$ is generally a p-type material, while $SrTiO_3$ is generally an n-type material. As shown in FIG. 6a, this results in spatial charge separation as holes and electrons migrate to the respective material. In contrast, the electrostatic barrier of FIG. 6b in an n-type/n-type interface does not promote this separation.

Thus, although there has been described to this point a particular embodiment for a method and apparatus for producing quantum dots with spatially separated electron-hole pairs, it is not intended that such specific references be considered as limitations upon the scope of this invention except in-so-far as set forth in the following claims.

What is claimed is:

1. A method for producing metal oxide quantum dots, the method comprising:
   a) cleaning an oxide substrate comprised of $\alpha\text{-}Cr_2O_3$;
   b) cleaning a source comprised of a metal;
   c) heating the substrate; and
   d) exposing the substrate to the source in an oxygen environment causing metal oxide quantum dots to form on the surface of the substrate.

2. A method for producing metal oxide quantum dots, the method comprising:
   a) cleaning an oxide substrate;
   b) cleaning a source comprised of a metal;
   c) heating the substrate;
   d) exposing the substrate to the source in an oxygen environment causing metal oxide quantum dots to form on the surface of the substrate; and
   e) subjecting the dots formed on the substrate to a post-growth annealing.

3. The method of claim 2, wherein the post-growth annealing further comprises exposing the quantum dots to oxygen plasma with oxygen partial pressure approximately equal to $1\times10^{-5}$ Torr at a temperature in the range of approximately 620° C. to approximately 650° C.

4. The method of claim 3, wherein the quantum dots have a lateral dimension of less than or equal to 10 nanometers after the post-growth annealing.

* * * * *